United States Patent
Joo et al.

(10) Patent No.: US 9,741,483 B2
(45) Date of Patent: Aug. 22, 2017

(54) NOISE FILTER AND ELECTRONIC DEVICE WITH INTEGRATED COMMON MODE AND NORMAL MODE NOISE FILTERS

(71) Applicant: SAMSUNG ELECTRONICS CO., LTD., Suwon-si (KR)

(72) Inventors: Sung-yong Joo, Yongin-si (KR); Jin-hyung Lee, Anyang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 41 days.

(21) Appl. No.: 14/244,334

(22) Filed: Apr. 3, 2014

(65) Prior Publication Data

US 2014/0354391 A1    Dec. 4, 2014

(30) Foreign Application Priority Data

Jun. 3, 2013   (KR) .......................... 10-2013-0063445

(51) Int. Cl.
*H01F 17/06* (2006.01)
*H03H 7/00* (2006.01)
(Continued)

(52) U.S. Cl.
CPC ............. *H01F 17/06* (2013.01); *H01F 27/38* (2013.01); *H03H 1/0007* (2013.01); *H01F 2017/0093* (2013.01)

(58) Field of Classification Search
CPC ....... H01F 2017/0093; H01F 2027/348; H01F 38/14; H01F 38/08; H01F 27/385; H01L 7/427; H01L 2001/0092
(Continued)

(56) References Cited

U.S. PATENT DOCUMENTS 4,122,385 A * 10/1978 Oberbeck .............. H02H 9/021
                                                        323/362
4,393,157 A *  7/1983 Roberge .................. H01F 21/08
                                                        323/355
(Continued)

FOREIGN PATENT DOCUMENTS

JP       2007-048897 A    2/2007
JP       2007214789 A    8/2007
(Continued)

OTHER PUBLICATIONS

Communication dated Jun. 6, 2014, issued by the European Patent Office in counterpart European Application No. 13198185.4.

*Primary Examiner* — Alexander Talpalatski
*Assistant Examiner* — Joselito Baisa
(74) *Attorney, Agent, or Firm* — Sughrue Mion, PLLC

(57) ABSTRACT

A noise filter and an electronic device including the same are disclosed. The noise filter is configured to suppress noise generated in a power line or a ground line of a power circuit unit provided in an electronic device. The electronic device including: at least one coil connected to the power line and the ground line; and a core around which the coil is wound, a common core portion configured to suppress common mode noise generated at the ground line and a normal core portion configured to suppress normal mode noise generated at the power line are formed as a single body. Thus, the common mode noise filter and the normal mode noise filter are integrated with each other to thereby improve productivity and reduce production costs.

16 Claims, 7 Drawing Sheets

(51) Int. Cl.
*H01F 27/38* (2006.01)
*H03H 1/00* (2006.01)
*H01F 17/00* (2006.01)

(58) Field of Classification Search
USPC .......... 336/178, 214, 221; 333/181, 185, 12
See application file for complete search history.

(56) References Cited

U.S. PATENT DOCUMENTS

| | | | | |
|---|---|---|---|---|
| 4,427,955 A | * | 1/1984 | Roberts | H03H 7/09 |
| | | | | 315/239 |
| 4,543,554 A | * | 9/1985 | Muellenheim | H01F 17/062 |
| | | | | 333/12 |
| 4,864,478 A | | 9/1989 | Bloom | |
| 4,910,482 A | * | 3/1990 | Takagai | H01F 38/02 |
| | | | | 333/12 |
| 5,155,457 A | * | 10/1992 | Oda | H03H 1/0007 |
| | | | | 333/167 |
| 5,313,176 A | * | 5/1994 | Upadhyay | B82Y 25/00 |
| | | | | 333/181 |
| 5,629,661 A | * | 5/1997 | Ooi | H01F 17/04 |
| | | | | 336/198 |
| 5,783,984 A | * | 7/1998 | Keuneke | H03H 7/38 |
| | | | | 336/155 |
| 5,977,853 A | * | 11/1999 | Ooi | H01F 17/04 |
| | | | | 336/160 |
| 6,624,724 B2 | * | 9/2003 | Tomita | H01F 37/00 |
| | | | | 333/177 |
| 6,987,372 B1 | * | 1/2006 | Wu | H02M 5/4585 |
| | | | | 318/448 |
| 7,352,594 B2 | * | 4/2008 | Cester | H02M 5/272 |
| | | | | 333/181 |
| 7,423,520 B2 | * | 9/2008 | Wasaki | H03H 7/09 |
| | | | | 340/12.32 |
| 2005/0280481 A1 | * | 12/2005 | Shih | H01F 37/00 |
| | | | | 333/181 |
| 2006/0006963 A1 | * | 1/2006 | Ji | H01F 17/062 |
| | | | | 333/181 |
| 2006/0049890 A1 | * | 3/2006 | Wasaki | H03H 7/427 |
| | | | | 333/12 |
| 2007/0257759 A1 | * | 11/2007 | Lee | H01F 17/062 |
| | | | | 336/90 |
| 2008/0129438 A1 | * | 6/2008 | Lee | H01F 1/26 |
| | | | | 336/220 |
| 2009/0295524 A1 | * | 12/2009 | Silva | H01F 3/10 |
| | | | | 336/170 |
| 2012/0225305 A1 | | 9/2012 | Pot | |
| 2012/0280779 A1 | | 11/2012 | Shih | |
| 2013/0015863 A1 | | 1/2013 | Lamesch et al. | |
| 2013/0020305 A1 | | 1/2013 | Lamesch et al. | |
| 2013/0049918 A1 | | 2/2013 | Fu et al. | |
| 2013/0069615 A1 | | 3/2013 | Choi et al. | |

FOREIGN PATENT DOCUMENTS

| | | |
|---|---|---|
| JP | 2009135271 A | 6/2009 |
| JP | 2011119477 A | 6/2011 |

* cited by examiner

NOISE FILTER AND ELECTRONIC DEVICE WITH INTEGRATED COMMON MODE AND NORMAL MODE NOISE FILTERS

CROSS-REFERENCE TO RELATED APPLICATION

This application claims priority from Korean Patent Application No. 10-2013-0063445, filed on Jun. 3, 2013 in the Korean Intellectual Property Office, the disclosure of which is incorporated herein by reference, in its entirety.

BACKGROUND

Field

Apparatuses and methods consistent with the exemplary embodiments relate to a noise filter and an electronic device including the same. More particularly, the exemplary embodiments relate to a noise filter and an electronic device including the same, in which a common mode noise filter and a normal mode noise filter are integrated with each other.

Description of the Related Art

With rapid development of digital and semiconductor technologies, electronic and computer industrial fields have experienced remarkable development. However, an electromagnetic wave radiated or conducted from an electric/electronic device has problems in that it serves as noise that influences other neighboring devices, and thus causes operational problems, and it is known to be injurious to a human body. Therefore, the international society has settled "electromagnetic interference (EMI) standards" so that the electromagnetic waves radiated from all the electric/electronic devices can be below a predetermined level.

Noise includes two kinds of noise, i.e., radiant noise transferred to the atmosphere and conductive noise transferred through a main power line of an electronic device. The conductive noise includes a common mode noise C transferred between a power line and a ground line, and a normal mode noise N reciprocating in the power line (refer to FIG. 1). Except for particular cases, the electronic device always includes the common mode noise C and the normal mode noise N.

Therefore, a general electronic device includes a common mode noise filter 10 for suppressing the common mode noise generated at the ground line, and a normal mode noise filter 20 for suppressing the normal mode noise generated at the power line. The noise filters are separately manufactured and respectively mounted on a printed circuit board 30, thereby increasing production costs and restricting miniaturization because they occupy respective installation spaces.

SUMMARY

One or more exemplary embodiments may provide a noise filter and an electronic device including the same, in which a common mode noise filter and a normal mode noise filter are integrated with each other in order to thereby improve productivity and reduce production costs.

According to an aspect of an exemplary embodiment, a noise filter for suppressing noise generated in a power line or a ground line of a power circuit provided in an electronic device is provided. The noise filter includes at least one coil connected to the power line and the ground line; and a core around which the coil is wound, and in which a common core portion for suppressing common mode noise generated at the ground line and a normal core portion for suppressing normal mode noise generated at the power line are formed as a single, integrated body.

The common core portion and the normal core portion may be symmetric with each other.

The common core portion may be configured as a closed loop where magnetic flux circulates.

The common core portion may include a first side around which a first coil is wound, and a second side which is opposite to the first side and around which a second coil is wound.

The normal core portion may be configured as a loop where magnetic flux circulates, and include an opening where the loop is opened at one side.

The normal core portion may include a first side around which a third coil is wound and a second side which is opposite to the first side and around which a fourth coil is wound.

The opening may include a gap having a width which corresponds to the inductance needed to suppress the normal mode noise.

The normal core portion may protrude from one side of the common core portion in the form of a cantilever.

The normal core portion may be configured in the form of a semicircular shape, from one side of the common core portion.

The normal core portion may further include an opening, and the opening may include a gap having a width which corresponds to the inductance needed to suppress the normal mode noise.

A bobbin wound around with the coil and coupled to the core may be further included.

According to an aspect of another exemplary embodiment, the noise filter includes a common core portion configured to suppress common mode noise generated at the ground line; a common coil portion wound around the common core portion and connected to the ground line; a normal core portion for suppressing normal mode noise generated at the power line; a normal coil portion wound around the normal core portion and connected to the power line; and the common core portion and the normal core portion being coupled to each other.

According to an aspect of an exemplary embodiment, an electronic device is provided including a power circuit configured to supply power to cause the electronic device perform a predetermined function; and a noise filter which is provided in the power circuit and configured to suppress noise generated in a power line or a ground line of the power circuit, the noise filter including: at least one coil connected to the power line and the ground line; and a core around which the coil is wound, and in which a common core portion which suppresses common mode noise generated at the ground line and a normal core portion which suppresses normal mode noise generated at the power line are formed as a single integrated body.

The common core portion and the normal core portion may be symmetric with each other.

The common core portion may be configured as a closed loop where magnetic flux circulates.

The common core portion may include a first side around which a first coil is wound, and a second side which is opposite to the first side and around which a second coil is wound.

The normal core portion may be configured as a loop where magnetic flux circulates, and may include an opening where the loop is opened at one side.

The normal core portion may include a first side around which a third coil is wound, and a second side which is opposite to the first side and around which a fourth coil is wound.

The opening may include a gap having a width which corresponds to the inductance needed to suppress the normal mode noise.

The normal core portion may protrude in the form of a cantilever from one side of the common core portion.

The normal core portion may be formed in a semicircular shape from one side of the common core portion.

The normal core portion may further include an opening, and the opening may include a gap having a width which corresponds to inductance needed to suppress the normal mode noise.

A bobbin wound around with the coil and coupled to the core may be further included.

According to an aspect of another exemplary embodiment, an electronic device is provided including a power circuit configured to supply power to cause the electronic device perform a predetermined function; and a noise filter which is provided in the power circuit and suppresses noise generated in a power line or a ground line of the power circuit, the noise filter including: a common core portion which suppresses common mode noise generated at the ground line; a common coil portion wound around the common core portion and connected to the ground line; a normal core portion which suppresses normal mode noise generated at the power line; a normal coil portion wound around the normal core portion and connected to the power line; and the common core portion and the normal core portion being coupled to each other.

An aspect of an exemplary embodiment may provide a noise filter configured to suppress noise generated in a power line or a ground line of a power circuit provided in an electronic device, the noise filter including: a core around which a coil is wound, and in which a common core portion for suppressing common mode noise generated at the ground line and a normal core portion for suppressing normal mode noise generated at the power line are formed as a single body.

The noise filter further includes a coil wrapped around the core. The common core portion and the normal core portion may be integrally formed as a single body.

The normal core portion may protrude from one side of the common core portion in the form of a cantilever.

Another aspect of the exemplary embodiments may provide an electronic device including: a power circuit configured to supply power to the electronic device; and a noise filter configured to suppress noise generated in a power line or a ground line of the power circuit, the noise filter may include: a core around which a coil is wound, and in which a common core portion configured to suppress common mode noise generated at the ground line and a normal core portion to suppress normal mode noise generated at the power line are formed as a single body.

The common core portion and the normal core portion may be integrally formed as a single body.

In addition, the normal core portion may protrude from one side of the common core portion in the form of a cantilever.

BRIEF DESCRIPTION OF THE DRAWINGS

The above and/or other aspects will become apparent and more readily appreciated from the following description of exemplary embodiments, taken in conjunction with the accompanying drawings, in which.

DETAILED DESCRIPTION OF EXEMPLARY EMBODIMENTS

A noise filter and an electronic device including the same according to exemplary embodiments will be described in detail with reference to the accompanying drawings.

Figure 1:
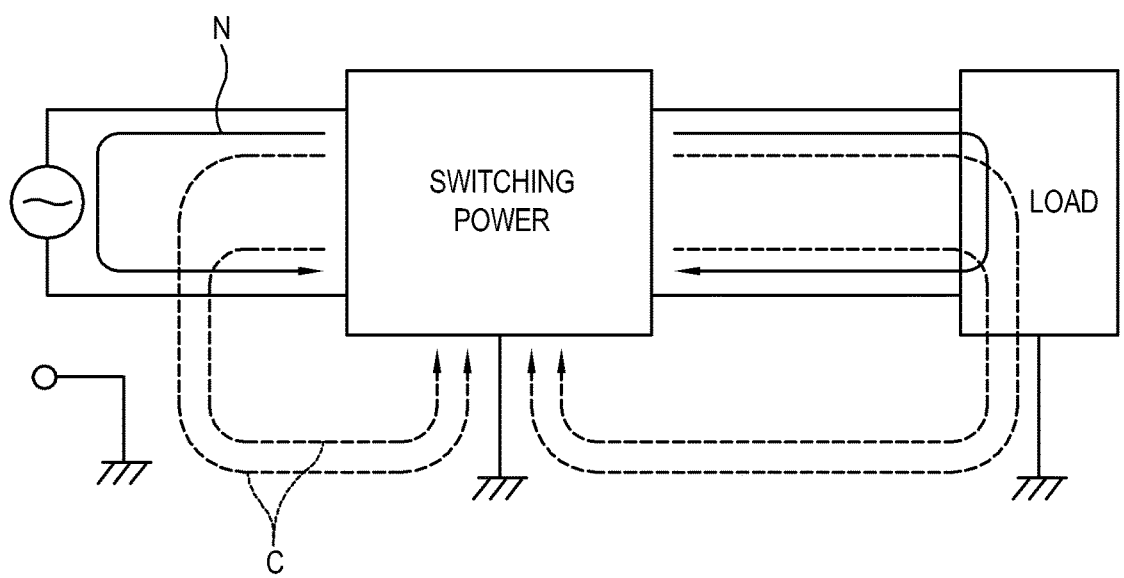
FIG. 1 is a schematic circuit diagram which illustrates circulation of common mode noise and normal mode noise.
Figure 2:
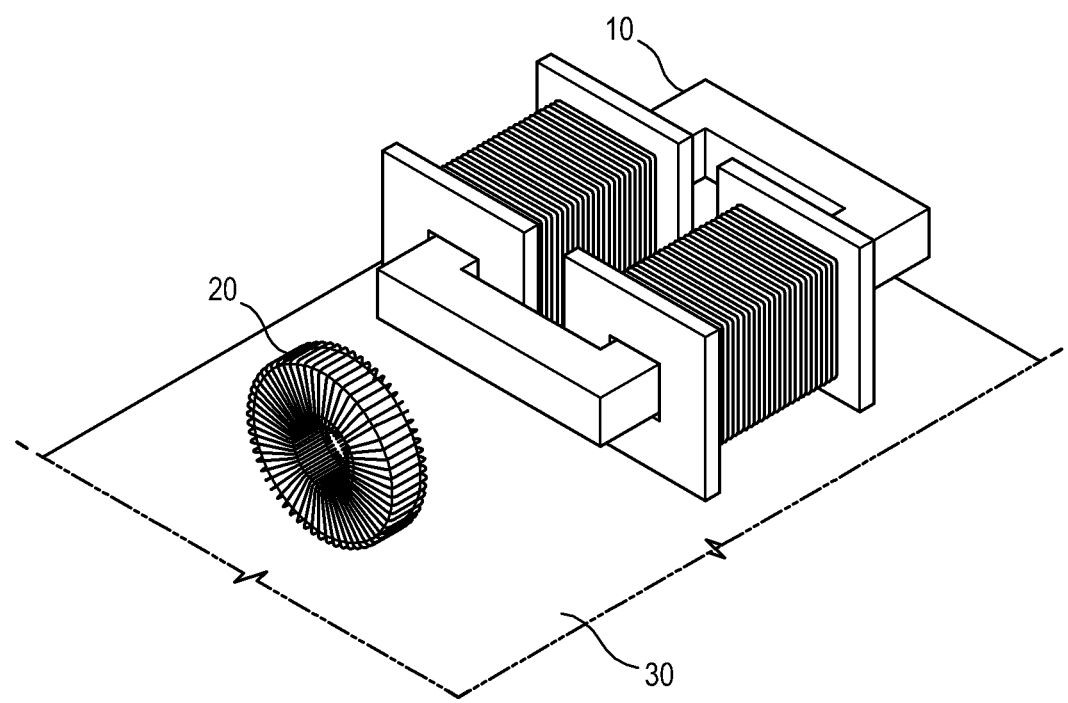
FIG. 2 is a perspective view which schematically shows a printed circuit board of the related art where a common mode noise filter and a normal mode noise filter are mounted.

FIG. 1 shows a schematic diagram illustrating the circulation of common mode noise, indicated as "C" and normal mode noise indicated as "N."

Figure 3:
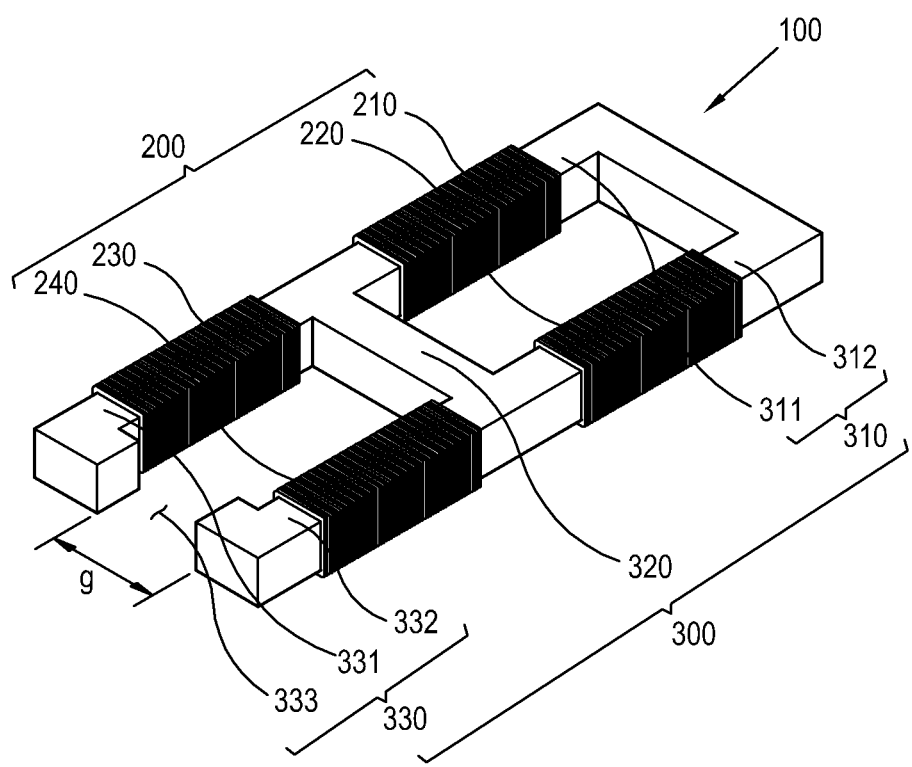
FIG. 3 is a perspective view which schematically shows a noise filter, according to an exemplary embodiment.

As shown in FIG. 3, a noise filter 100 according to an exemplary embodiment is an inductor that includes a coil 200, and a core 300 around which the coil 200 is wound.

The coil 200 is made of a conductive material such as copper or the like, and is electrically connected to a power line or a ground line of a power circuit provided in the electronic device. The coil 200 is wound around a certain part of the core 300 at a regular pitch to have predetermined inductance, and generates induced electromotive force based on a variation of current supplied from the power line.

The core 300 includes a common core portion 310 for suppressing common mode noise generated at the ground line of the power circuit provided in the electronic device, and a normal core portion 330 for suppressing normal mode noise generated at the power line, in which the common core portion 310 and the normal core portion 330 are formed as a single body. Further, the common core portion 310 and the normal core portion 330 include a shared portion 320 where one side thereof are shared, and are formed symmetrically with respect to the shared portion 320. The core 300 may be manufactured with ferrite that is a kind of magnetic substance made of iron compound, but is not limited thereto. Alternatively, the core 300 may be manufactured with various materials.

The common core portion 310 is shaped like a hollow quadrangle in which magnetic flux circulates forming a closed loop. Further, the common core portion 310 includes a first side 311 around which a first coil 210 is wound, and a second side 312 which is opposite to a first side 311 and around which a second coil 220 is wound.

The normal core portion 330 is shaped like a loop where magnetic flux circulates, and is formed with an opening 333 opened at one side of the loop. Further, the normal core portion 330 includes a first side 331 around which a third coil 230 is wound, and a second side 332 which is opposite to the first side 331 with the opening 333 there between and around which a fourth coil 240 is wound.

The opening 333 has a gap g which corresponds to the inductance needed for suppressing normal mode noise generated at the power line. Therefore, in response to target inductance of the normal core portion 330 is determined; the gap g of the opening 333 is adjusted to correspond to the target inductance.

Figure 4:
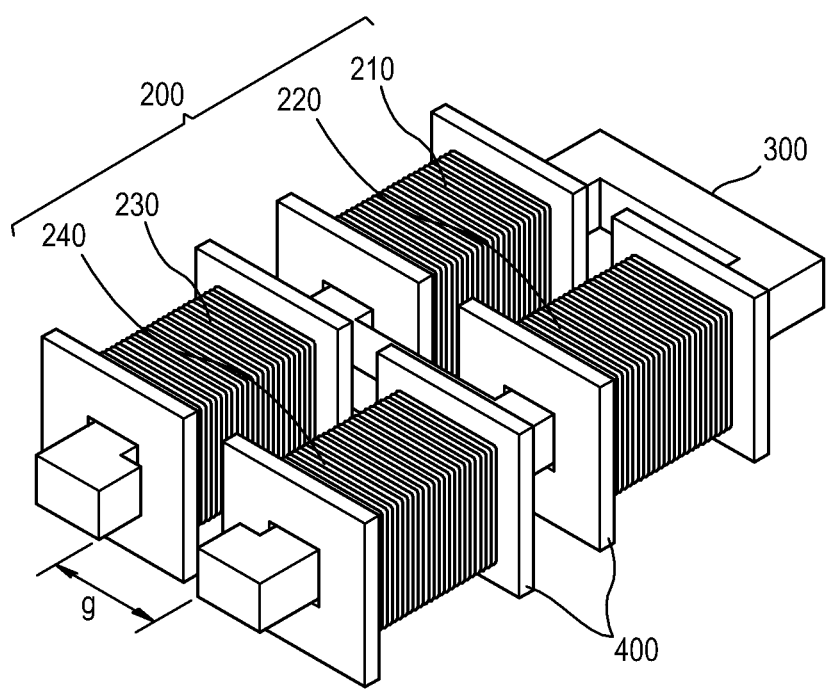
FIG. 4 is a perspective view which schematically shows a noise filter according to another exemplary embodiment.

As shown in FIG. 4, the coil 200 is wound around a bobbin 400 and is installed on core 300. At this time, the bobbin 400 wound around with the coil 200 is installed on the core 300 and then fastened by impregnation for infiltrating a liquid insulating material thereto.

Figure 5:
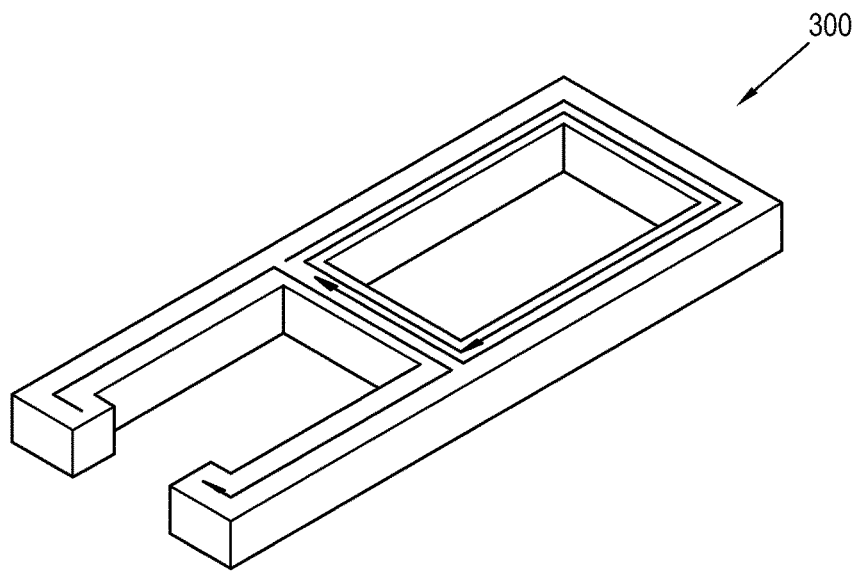
FIG. 5 is a schematic view which shows a circulating direction of a line of a magnetic force in a core of a noise filter, according to an exemplary embodiment.

FIG. 5 illustrates a line of magnetic force circulating in the core 300 according to an exemplary embodiment. In response to an electric current flowing in the coil, the line of magnetic force is generated as an arrow in the core by electromagnetic induction. Thus, the line of generated magnetic force suppresses the common mode noise in the common core portion 310, and suppresses the normal mode noise in the normal core portion 320. The coil wound around the core is not illustrated therein in order to give prominence to the lines of magnetic force.

Figure 6:
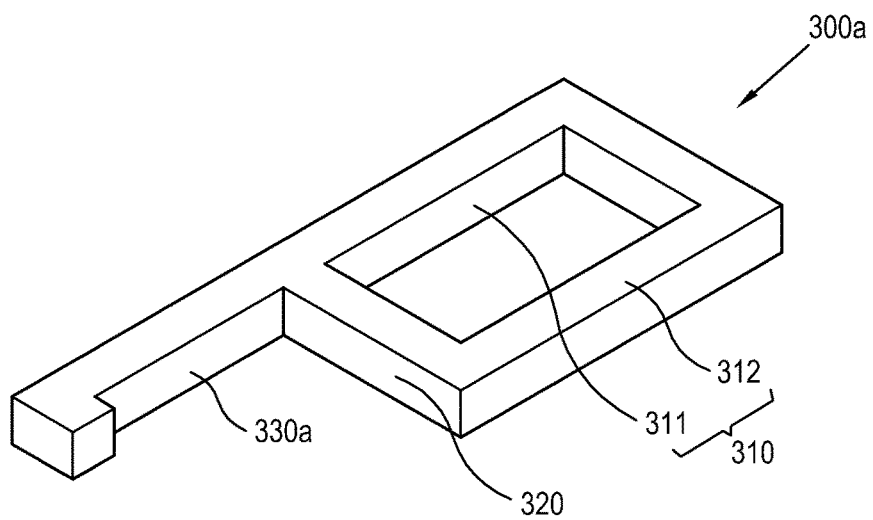
FIGS. 6 to 8 are perspective views which schematically shows the core of the noise filter according to yet another exemplary embodiment.
Figure 7:
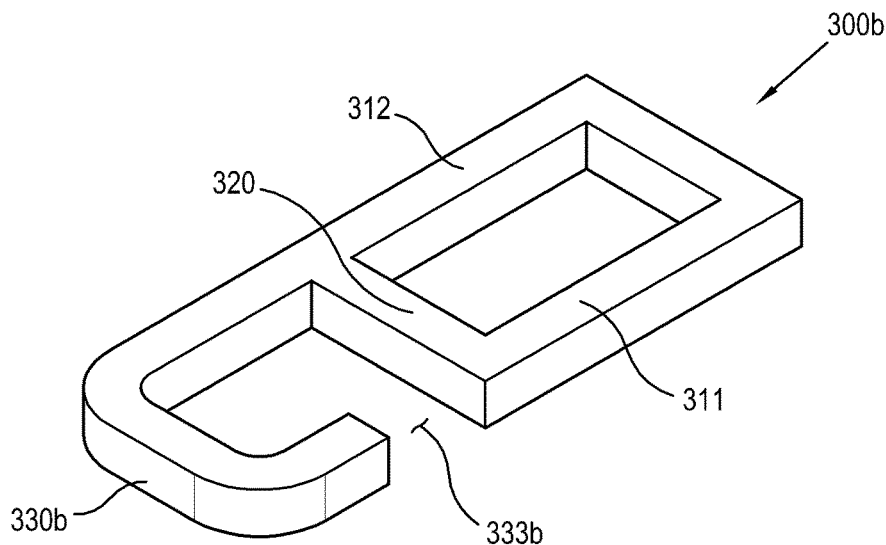

FIGS. 6 and 7 illustrate a noise filter according to another exemplary embodiment.

As shown in FIG. 6, the normal core portion 330a may protrude in the form of a cantilever from one side of the common core portion 310 having a hollow quadrangular shape.

The coil is wound around the first side 311 and the second side 312 of the common core portion 310, and the coil is wound around the normal core portion 330a protruding from the shared portion 320 in the form of a cantilever.

As shown in FIG. 7, the normal core portion 330b may have a semicircular shape from one side of the common core portion 310 which is shaped like a hollow quadrangle.

The coil is wound around the first side 311 and the second side 312 of the common core portion 330b, and the coil (not shown) is wound around the normal core portion 330b having the semicircular shape in the shared portion 320.

Further, the normal core portion 330b having the semicircular shape may be formed with opening 333b having a gap which corresponds to the inductance needed to suppress the normal mode noise generated at the power line.

Figure 8:
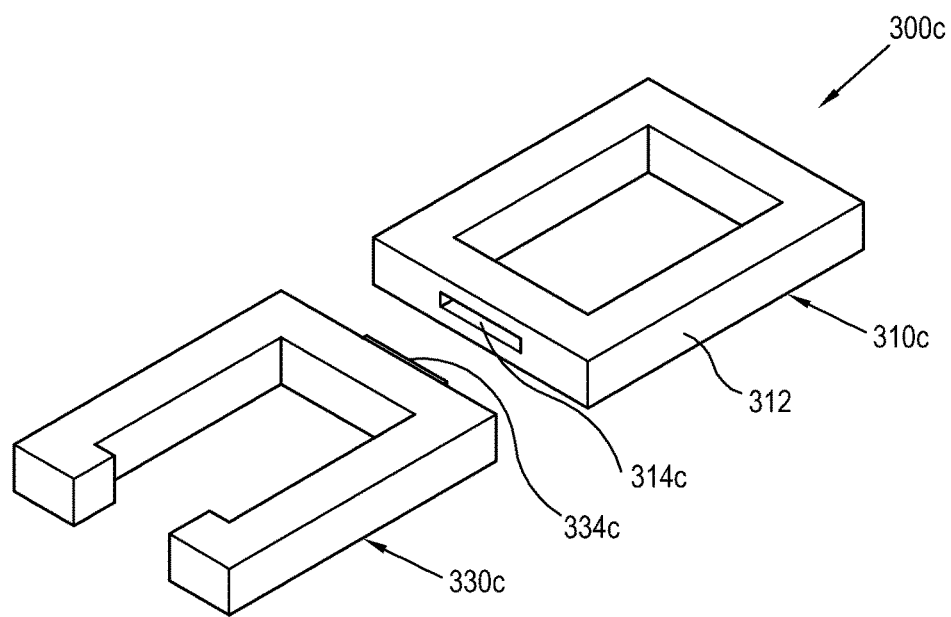

As shown in FIG. 8, the core 300c of the noise filter may be provided by separately manufacturing the common core portion 310c and the normal core portion 330c and then coupling them. At this time, a projection 334c is formed at one side of the normal core portion 330c, and a groove 314c is provided at one side of the common core portion 310c, so that the common core portion 310c and the normal core portion 330c can be coupled to each other. Of course, the method of coupling the normal core portion 330c and the common core portion 310c is not limited thereto. Alternatively, various coupling methods may be employed as would be understood by one of ordinary skill in the art.

According to an exemplary embodiment, the noise filter 100 may be used in an electronic device 500.

Figure 9:
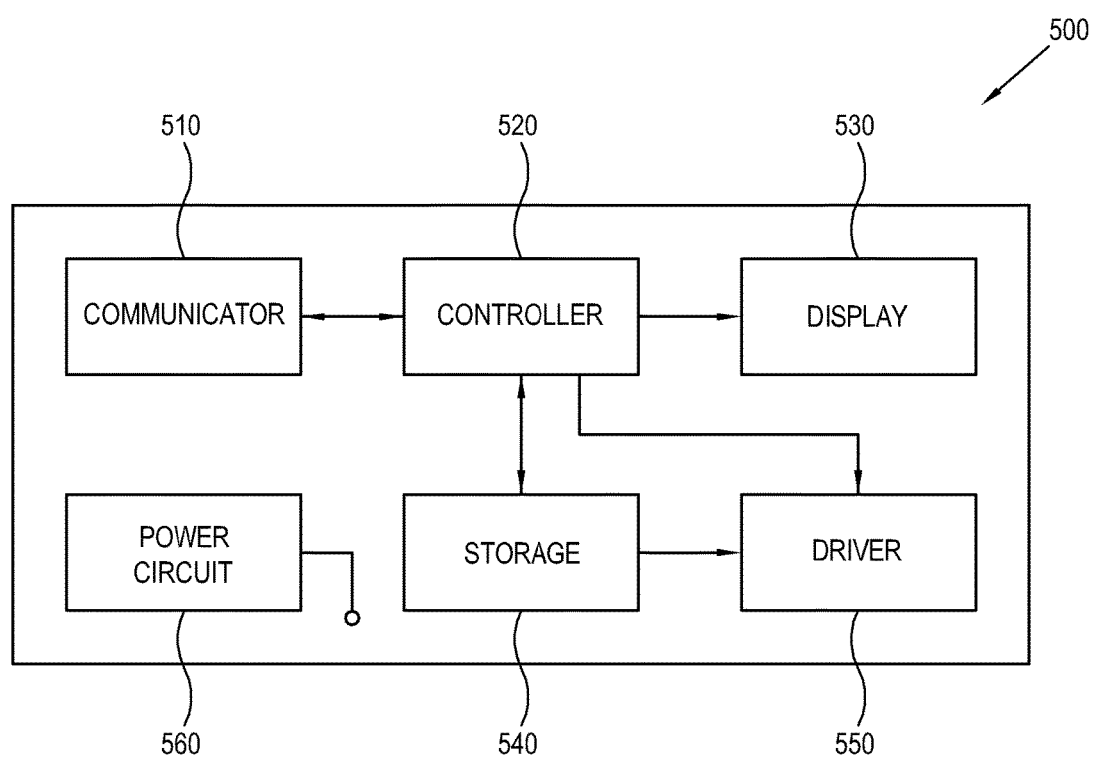
FIG. 9 is a block diagram which schematically shows the electronic device.

FIG. 9 is a block diagram schematically showing the electronic device 500.

As shown in FIG. 9, the electronic device 500 may include a communicator 510 configured to receive a data signal from an exterior source, a controller 520 configured to control operations of the electronic device 500 in response to a signal received through communicator 510, a driver 550 configured to perform predetermined operations under the control of the controller 520, a storage 540 configured to store information and a program needed for the operations of driver 550, a display 530 configured to display an image, and a power circuit 560 which receives external power and supplies the power needed to drive the foregoing elements.

According to an exemplary embodiment, the noise filter is mounted to the power circuit 560 and suppresses the common mode noise and the normal mode noise generated in the electronic device 500. At this time, in the core of the noise filter, the common core portion and the normal core portion may be provided as a single body, or may be provided separately and then assembled.

According to an exemplary embodiment, there is provided a noise filter and an electronic device including the same, in which the common mode noise filter and the normal mode noise filter can be manufactured as a single body, thereby having on the effect of improving productivity and reducing production costs.

Further, a noise filter according to an exemplary embodiment and an electronic device including the same provide improved efficiency as compared with a method of using the normal mode noise filter in the related arts.

A noise filter according to an exemplary embodiment may occupy an installation space which is smaller than that of a noise filter of the related art, thereby being applied to a miniaturized electronic device.

Although a few exemplary embodiments have been shown and described, it will be appreciated by those skilled in the art that changes may be made in these exemplary embodiments without departing from the principles and spirit of the invention, the scope of which is defined in the appended claims and their equivalents.

What is claimed is:

1. A noise filter configured to suppress noise generated in a power line or a ground line of a power circuit provided in an electronic device, the noise filter comprising:
   at least one coil connected to the power line and the ground line; and
   a core around which the coil is wound, and in which a common core portion for suppressing common mode noise generated at the ground line and a normal core portion for suppressing normal mode noise generated at the power line are formed as a single body with a shared side between the common core portion and the normal core portion;
   wherein the common core portion is configured as a loop where magnetic flux circulates and includes a first side extending in a first direction and around which a first coil is wound, and a second side which extends in the first direction, is opposite to the first side and faces the first side in a second direction different from the first direction and around which a second coil is wound, wherein the first coil is spaced apart from second coil in the second direction; and
   the normal core portion is configured as a loop where magnetic flux circulates, and includes an opening opposite to the shared side and where the loop is opened at one side, a third side around which a third coil is wound, and a fourth side which is opposite to the third side and around which a fourth coil is wound.

2. The noise filter according to claim 1, wherein the common core portion and the normal core portion are symmetric with each other.

3. The noise filter according to claim 1, wherein the opening includes a gap having a width which corresponds to the inductance needed to suppress the normal mode noise.

4. The noise filter according to claim 1, wherein the normal core portion protrudes from one side of the common core portion in the form of a cantilever.

5. The noise filter according to claim 1, wherein the normal core portion is provided in the form of a semicircular shape from one side of the common core portion.

6. The noise filter according to claim 1, further comprising the first coil being wound around a first bobbin, the second coil being wound around a second bobbin, the third coil being wound around a third bobbin, and the fourth coil being wound around a fourth bobbin, and the first bobbin, the second bobbin, the third bobbin, and the fourth bobbin being coupled to their respective sides.

7. The noise filter of claim 1, wherein the common core portion and the normal core portion are integrally formed as a single body.

8. An electronic device comprising:
a power circuit configured to supply power to make the electronic device perform a predetermined function; and
a noise filter which is provided in the power circuit and configured to suppress noise generated in a power line or a ground line of the power circuit,
the noise filter comprising:
at least one coil connected to the power line and the ground line; and
a core around which the coil is wound, and in which a common core portion configured to suppress common mode noise generated at the ground line and a normal core portion to suppress normal mode noise generated at the power line are formed as a single body with a shared side between the common core portion and the normal core portion;
wherein the common core portion is further configured as a closed loop where magnetic flux circulates and includes a first side extending in a first direction and around which a first coil is wound, and a second side which extends in the first direction, is opposite to the first side and faces the first side in a second direction different from the first direction and around which a second coil is wound, wherein the first coil is spaced apart from the second coil in the second direction; and
the normal core portion is further configured as a loop where magnetic flux circulates, and includes an opening opposite to the shared side and where the loop is opened at one side, a third side around which a third coil is wound, and a fourth side which is opposite to the third side and around which a fourth coil is wound.

9. The electronic device according to claim 8, wherein the common core portion and the normal core portion are symmetric with each other.

10. The electronic device according to claim 8, wherein the opening includes a gap having a width which corresponds to the inductance needed to suppress the normal mode noise.

11. The electronic device according to claim 8, wherein the normal core portion protrudes from one side of the common core portion in the form of a cantilever.

12. The electronic device according to claim 8, wherein the normal core portion is provided in the form of a semicircular shape from one side of the common core portion.

13. The electronic device according to claim 12, wherein the normal core portion further includes an opening, and the opening includes a gap having a width which corresponds to the inductance needed to suppress the normal mode noise.

14. The electronic device according to claim 8, further comprising the first coil being wound around a first bobbin, the second coil being wound around a second bobbin, the third coil being wound around a third bobbin, and the fourth coil being wound around a fourth bobbin, and the first bobbin, the second bobbin, the third bobbin, and the fourth bobbin being coupled to their respective sides.

15. The electronic device of claim 8, wherein the common core portion and the normal core portion are integrally formed as a single body.

16. The noise filter according to claim 15, wherein the normal core portion protrudes from one side of the common core portion in the form of a cantilever.

* * * * *